United States Patent [19]

Moyer et al.

[11] Patent Number: 5,349,209
[45] Date of Patent: Sep. 20, 1994

[54] DIAMOND/ORGANIC LED

[75] Inventors: Curtis D. Moyer, Phoenix; Thomas B. Harvey, III; James E. Jaskie, both of Scottsdale, all of Ariz.

[73] Assignee: Motorola, Inc., Schaumburg, Ill.

[21] Appl. No.: 921,773

[22] Filed: Jul. 30, 1992

[51] Int. Cl.$^5$ ............... H01L 33/00; H01L 31/12; H01L 27/14; H01L 29/34

[52] U.S. Cl. .................. 257/80; 257/77; 257/98; 257/428; 257/431; 257/436; 257/449; 257/628

[58] Field of Search ............ 257/77, 80, 98, 428, 257/431, 449, 628, 436

*Primary Examiner*—Andrew J. James
*Assistant Examiner*—Valencia M. Wallace
*Attorney, Agent, or Firm*—Eugene A. Parsons

[57] ABSTRACT

A light emitting diode including a carrier injection layer of semiconductor material, such as diamond, and a light emitting layer of electroluminescent organic material, such as PPV, positioned to form a diode junction therebetween. The semiconductor material being selected to have a wider bandgap than the organic material and the materials being further selected to minimize the discontinuities at the junction which would cause energy spikes.

7 Claims, 3 Drawing Sheets

DIAMOND/ORGANIC LED present invention pertains to light emitting diodes and more specifically to light emitting diodes utilizing a semiconductor/organic junction.

BACKGROUND OF THE INVENTION

Information on many different types of organic light emitting diodes (LED) has been published. In general these prior art devices suffer from low efficiency, relatively high drive voltages, poor reliability and/or limitations in manufacturing capabilities (poor adaptability).

Many of these prior art devices use a low work function metal, such as MgAg (magnesium, silver) for an electron injection contact. Other devices utilize a calcium electron injection contact. A layer of electroluminescent organic material, such as $Alq_3$ (8-hydroxyquinoline aluminum), is applied to the electron injection contact and a hole injection material such as [1, 1-bis(4-di-p-tolylaminophenyl cyclohexane (BTC)] is applied to the $Alq_3$ to produce a PIN diode junction. The MgAg, or calcium, injects electrons into the junction, which electrons tunnel into the $Alq_3$ where they recombine with holes from the [1, 1-bis(4-di-p-tolylaminophenyl cyclohexane (BTC)] to form light.

The prior art discusses minimizing the Schottky barrier height so that the tunneling distance is reduced and, in some cases may even be eliminated. This decreases the work function of the cathode (electron injection contact) by decreasing the barrier for electron injection from the cathode to the organic recombination layer (electroluminescent organic material). This decreases the forward voltage of the device, thereby, allegedly increasing the net device efficiency. However, it should be noted that there is no, or very little, barrier for holes to flow from the electroluminescent organic material into the low work function cathode metal. Thus, metal based low work function tunneling injection cathodes suffer from a low injection efficiency. In other words, holes may flow into the metal cathode freely using up the applied current and creating heat.

Most of the prior art devices utilizing low work function cathodes utilize magnesium or calcium as the low work function material. A major problem with these devices is that the low work function metals are oxidation sensitive, leading to reliability problems with the cathode. These reliability problems are widely reported in the literature.

SUMMARY OF THE INVENTION

It is a purpose of the present invention to provide a new and improved semiconductor/organic light emitting diode.

It is a further purpose of the present invention to provide a new and improved semiconductor/organic light emitting diode which has improved efficiency, lower operating voltage and increased reliability.

These purposes and others are realized and the above problems are at least partially solved by a semiconductor/organic light emitting diode comprising a carrier injection layer including a semiconductor material with a selected bandgap, a light emitting layer including an electroluminescent organic material with a selected bandgap positioned on a surface of the carrier injection layer so as to form a junction therebetween, and the semiconductor material and the electroluminescent material being selected so that the bandgap of the semiconductor material is greater than the bandgap of the electroluminescent material and discontinuities at the junction which would cause energy spikes are minimized.

These purposes and others are further realized and the above problems at least partially solved by a method of manufacturing a semiconductor/organic light emitting diode comprising the steps of forming a carrier injection layer including a semiconductor material with a selected bandgap, forming a light emitting layer including an electroluminescent organic material with a selected bandgap on a surface of the carrier injection layer so as to form a junction therebetween, and selecting the semiconductor material and the electroluminescent material so that the bandgap of the semiconductor material is greater than the bandgap of the electroluminescent material and discontinuities at the junction, which would cause energy spikes, are minimized.

BRIEF DESCRIPTION OF THE DRAWINGS

Referring to the drawings.

DESCRIPTION OF THE PREFERRED EMBODIMENT

Figure 1:
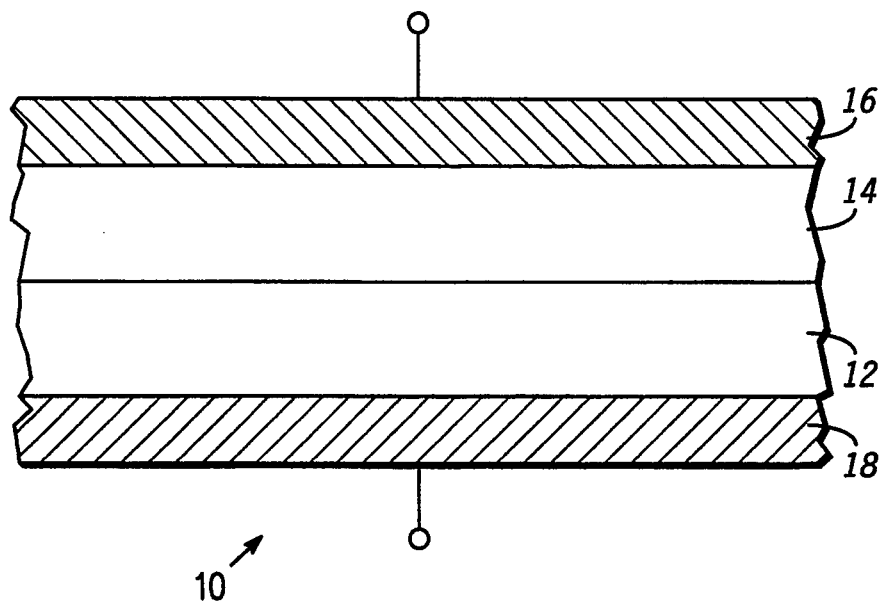
FIG. 1 is a simplified view in cross section of a semiconductor/organic light emitting diode embodying the present invention.

Referring specifically to FIG. 1, a simplified view in cross section of a semiconductor/organic light emitting diode 10 embodying the present invention is illustrated. Diode 10 includes a layer 12 of electroluminescent organic material, such as 8-hydroxyquinoline aluminum ($Alq_3$), a conjugated polymer such as poly(2-methoxy, 5-(2'-ethylhexoxy)-1, 4-phenylene-vinylene), poly(p-phenylene-vinylene) [PPV] or any of the other well known materials such as a bilayer of $Alq_3$ and a hole transport material which operate to emit light when properly energized. Diode 10 further includes a layer 14 of semiconductor material having an energy bandgap greater than the energy bandgap of the electroluminescent material. Layer 14 is positioned on layer 12 so as to form a junction therebetween and a layer 16 of metal contact material is positioned on the opposite side of layer 14. A layer 18 of an electrical conductor which is optically transparent is positioned on the side of layer 12 opposite the junction with layer 14. Layer 18 is a material such as indium tin oxide (ITO) which is well known in the art and utilized in many applications as an electrical contact in optical devices because of its transparency to light waves.

It will of course be understood by those skilled in the art that layers 12, 14, 16 and 18 can be deposited or formed in any convenient order depending upon the methods utilized, the specific materials included and the application. In general, from the view point of one skilled in the semiconductor art, PPV appears as a material that is doped for P-type conduction and, therefor, layer 14 of semiconductor material is doped for N-type conduction to provide the desired diode action. It should be noted, and will become apparent presently, that an N-type electroluminescent material can be utilized with a P-type semiconductor material.

Figure 2:
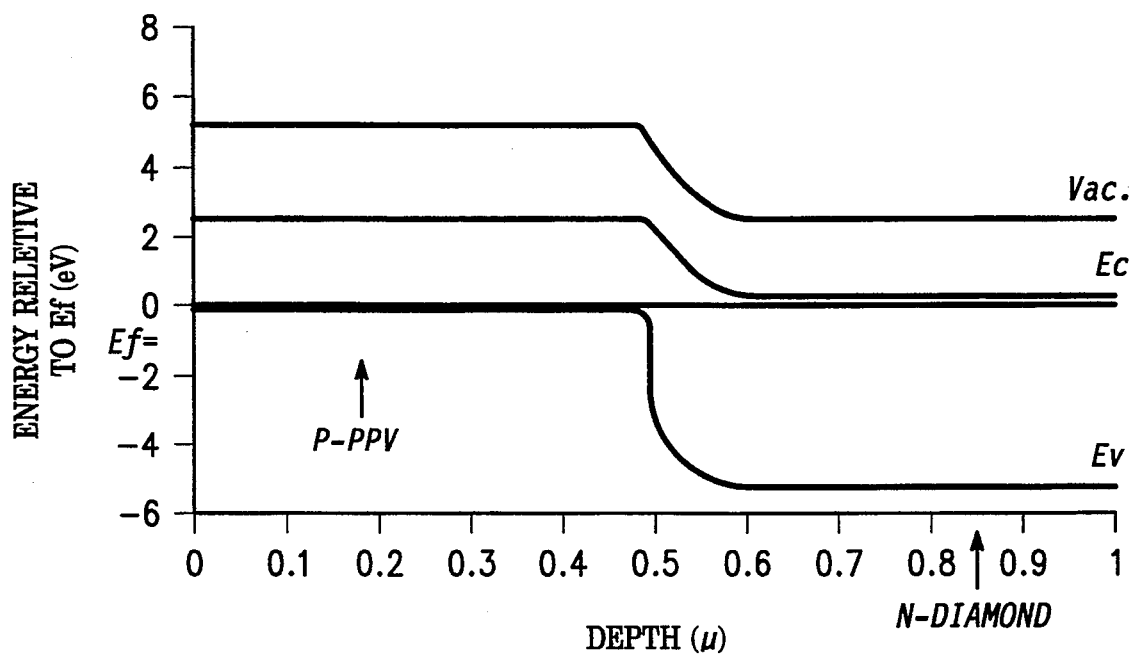
FIG. 2 is an energy diagram of the diode of FIG. 1 utilizing the (100) surface of a diamond semiconductor at the diode junction.

Referring specifically to FIG. 2, a Fermi energy level diagram for diode 10 is illustrated wherein layer 12 of electroluminescent material is chosen to be PPV with a P-type conduction and layer 14 of semiconductor material is chosen to be diamond doped for an N-type conduction. FIG. 2 illustrates a curve, Vac, depicting the energy required to emit electrons from the material into free space (vacuum), a curve, Ec, depicting the conduction band and a curve, Ev, depicting the valence band. In the diamond material, which is doped for an N-type conduction, electrons are the majority carrier and, hence, layer 14 is an electron injection layer. Layer 12, in which holes are the majority carrier or have been supplied by a hole injection material, emits light upon the injection of electrons therein and the recombination of the injected electrons with holes.

It should be noted from FIG. 2 that the bandgap (distance between the valence band, Ev, and the conduction band, Ec) of the diamond material is wider than the bandgap of the PPV material. In this instance the term "wider" means at least three kT wider at room temperature, where k is Boltzmann's constant and T is temperature in Kelvin and one kT equals approximately 26 millielectron volts. It should also be noted that the materials are chosen to minimize discontinuities therebetween which would cause energy spikes. In the present example, which illustrates a heterojunction interface between the (100) diamond surface and the PPV, there is a very small energy spike in the conduction band which electrons must overcome to travel from the diamond to the PPV.

When a forward bias voltage is applied across diode from layer 16 to layer 18, the barrier to the flow of electrons from the diamond material, layer 14, to the PPV material, layer 12, is reduced or eliminated so that electrons flow freely. However, because of the wider bandgap in the diamond material there is still a several eV barrier to hole injection from the PPV material into the diamond material. Thus holes cannot flow freely from the PPV material into the diamond material using up the applied current and creating thermal energy.

Figure 3:
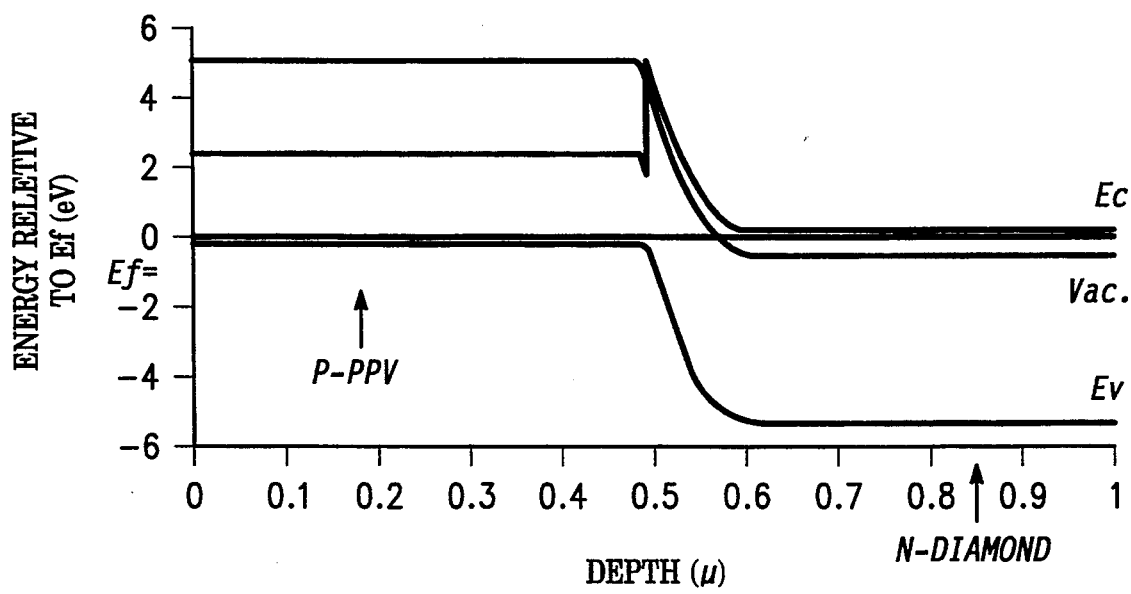
FIG. 3 is an energy diagram, similar to FIG. 2, utilizing the (111) surface of a diamond semiconductor at the diode junction.

Referring to FIG. 3, a Fermi energy level diagram for diode 10 is illustrated wherein layer 12 of electroluminescent material is chosen to be PPV with a P-type conduction and layer 14 of semiconductor material is chosen to be diamond doped for an N-type conduction and a heterojunction interface between the (111) diamond surface and the PPV is illustrated. In this example it can be seen that the interface forms a large energy spike in the conduction band. This indicates that the (111) face requires a higher forward bias so that adequate accumulation of electrons occurs at the interface which in turn narrows the spike depletion width allowing electron tunneling (probably hot electrons) from the diamond material to the PPV material. The higher voltage bias required results in a lower efficiency due to hot electron relaxation and the higher bias voltage for electron injection means that less of a valence band barrier exists under operation, to prevent hole injection into the diamond material, thereby wasting current.

Figure 4:
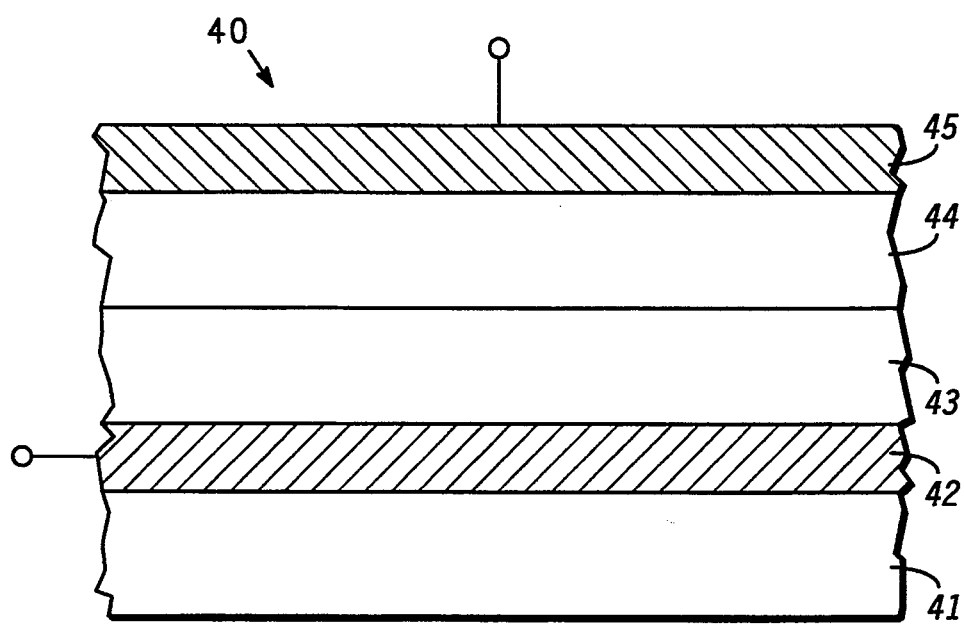
FIG. 4 is a simplified view in cross section of another embodiment of a semiconductor/organic light emitting diode incorporating the present invention.

FIG. 4 is a simplified view in cross section of another embodiment of a semiconductor/organic light emitting diode 40 incorporating the present invention. Diode 40 is constructed by starting with an optically transparent base 41 formed of some convenient material such as glass. A layer 42 of optically transparent conductive material is deposited on the surface of base 41 to form a first electrical contact. In this specific embodiment layer 42 is formed of indium tin oxide. A carrier injection layer 43 of semiconductor material which is optically transparent is deposited on layer 42. A typical example of an optically transparent semiconductor material is diamond. Next a light emitting layer 44 of electroluminescent material is deposited on carrier injection layer 43. Finally, an electrically conductive layer 45 is deposited on light emitting layer 44 to form a second electrical contact. Since it is desirable that all light emitted by layer 44 be directed through layers 43, 42 and 41, layer 45 is any convenient metal.

Figure 5:
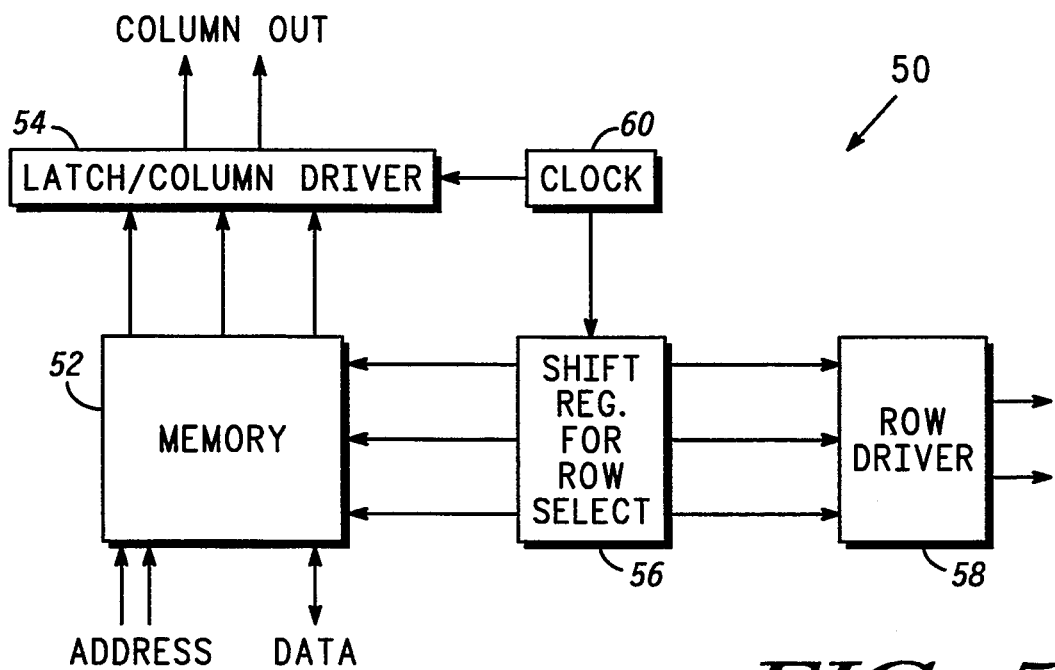
FIG. 5 is a simplified block diagram of driver circuitry, for driving a matrix display, such as illustrated in FIG. 6.

While semiconductor/organic light emitting diodes constructed in accordance with the present invention have a large variety of uses which will be apparent to those skilled in the art, these diodes are especially adaptable to displays. An example of such a display is illustrated in simplified block diagrams in FIGS. 5 and 6. Referring specifically to FIG. 5, driver circuitry 50 is illustrated in a simplified block diagram. Circuitry 50 includes a memory 52, column output circuitry 54, row selection circuitry 56, row driver circuitry 58 and a clock 60. In this embodiment, circuitry 50 is formed on a single semiconductor chip the surface of which generally corresponds to the surface of FIG. 6. Memory 52 is, for example, any of the electronic memories available on the market including but not limited to ROMs, PROMs, EPROMs, EEPROMs, RAMs etc. Driver circuitry 50 is designed to operate with a specific image generator, to be described presently, which image generator is useful in portable communications equipment and the like because of extremely low power requirements.

Image information is supplied to memory 52 by way of the data input and is stored in a predetermined location by means of an address supplied to the address input. The stored data is supplied to the display a complete row at a time by way of latch/column driver 54. Each bit of data for each column in the row is accessed in memory 52 and transferred to a latch circuit. The data may simply be sampled, actually removed from the memory and the memory refreshed, or new data introduced, while the current data is latched into the latch circuit. The current data is then supplied to the column drivers to drive each pixel in the row simultaneously. At the same time, shift register 56 is sequentially selecting a new row of data each time a pulse is received from clock 60. The newly selected row of pixels is actuated by row drivers 58 so that data supplied to the same pixels by latch/column drivers 54 causes the pixel to emit the required amount of light.

Figure 6:
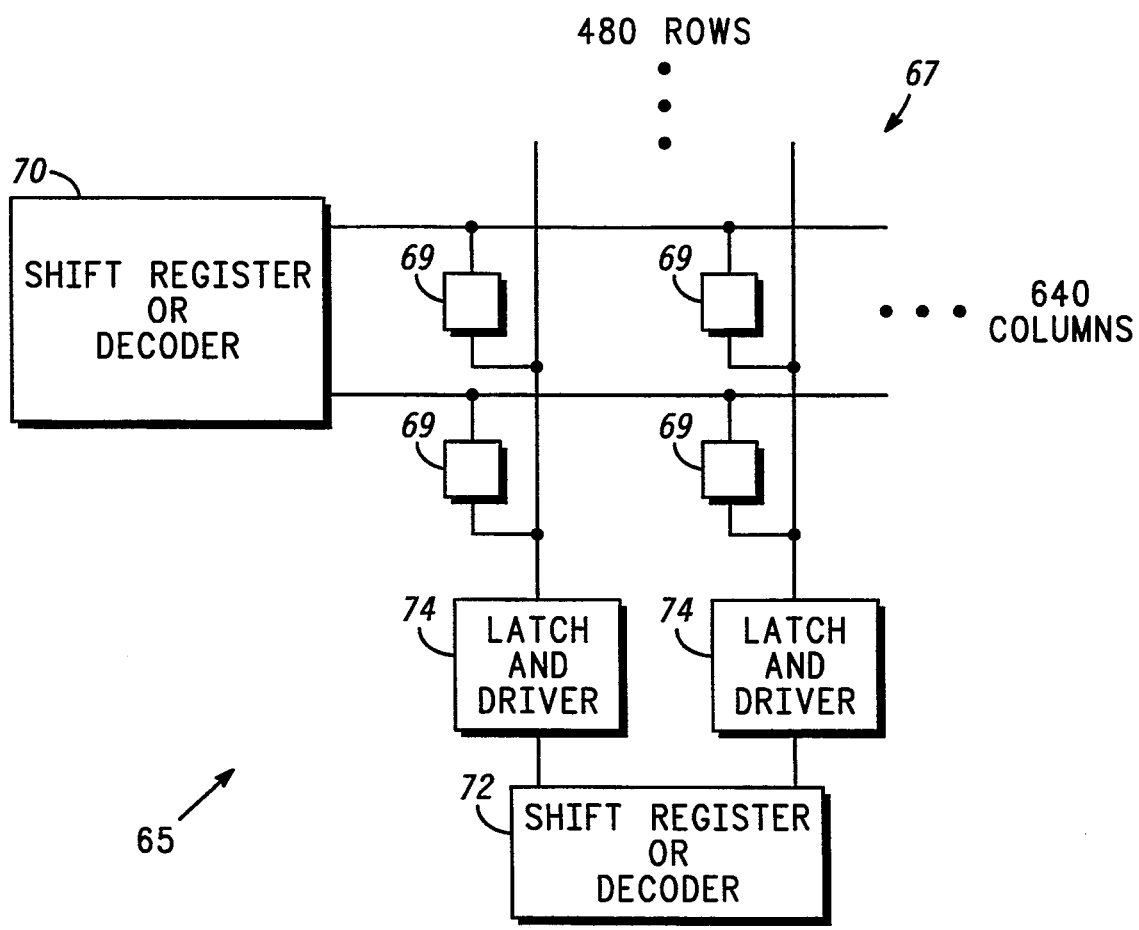
FIG. 6 is a block diagram of a matrix display incorporating semiconductor/organic light emitting diodes constructed in accordance with the disclosed method.

Referring to FIG. 6, a block diagram of a matrix display 65, portions thereof removed, is illustrated. Display 65 includes an image generator 67 with a plurality of pixels 69 each having at least one semiconductor/organic light emitting diode, with the pixels being connected in a matrix of rows and columns. In this particular embodiment the rows contain 640 pixels and the columns contain 480 pixels, which in this embodiment is a complete page (image). Display 65 further includes driver circuitry 50 from FIG. 5. As illustrated in FIG. 6, a shift register or decoder 70 is connected to the row inputs of image generator 67 and a shift register or decoder 72 is connected through a plurality of latch and driver circuits 74 to the column inputs of image generator 67. Shift register or decoder 70 may be, for example, shift register 56 and row driver 58 of FIG. 5. Shift register or decoder 72 is, for example, memory 52 of FIG. 5. In this configuration with pixels 69 including semiconductor/organic light emitting diodes, a first electrical contact of each diode is connected to the row lines and a second electrical contact of each diode is connected to the column lines.

In the operation of matrix display 65, one row of display data is loaded into latch and driver circuits 74 associated with each of the column lines. Once this has been accomplished, a row is selected and energized by shift register or decoder 70, illuminating the appropriate pixels 69 according to the data stored in latch and driver circuits 74. While the selected row is being energized, the display data corresponding to the next row in the sequence is loaded into latch and driver circuits 74 and the procedure is repeated. Assuming a repetition rate of 60 frames per second, each row is illuminated for approximately 35 microseconds.

There are two basic approaches for energizing the appropriate row and for transferring data to the appropriate columns. One approach uses decoders while the other approach uses shift registers. In the decoder approach, each row or column is individually addressed. The number of rows in matrix display 65, for example, requires a 9 bit address while the number of columns requires a 10 bit address. The circuitry required to sequence through the addresses is well understood by those skilled in the art and is not included herein for simplicity. The shift register approach takes advantage of the fact that random access to the rows and columns is not generally required in matrix displays, they need only be addressed sequentially. The advantage to the shift register approach is that it only requires a clock and a pulse to initiate a new row sequence. Both approaches are believed to have applications in matrix displays.

It should also be noted that the matrix display could be a simple monochrome configuration, a display utilizing monochrome grayscale, or color. For a simple monochrome display, only a one bit digital signal is needed for each pixel, as the pixel is either on or off. For a display utilizing a monochrome grayscale, either an analog signal or a multi-bit digital signal is required. A sixteen level grayscale, for example, needs a four bit digital signal. A grayscale could also be created utilizing pulse code modulation techniques. Full color, generally requires at least three light emitting elements per pixel, one for each of the basic colors (red, green and blue), and a type of grayscale signal system to achieve the appropriate amount of each color. The semiconductor/organic light emitting diode is easily adaptable to color displays by including, for example, "dyes" of the desired color in the light emitting organic material.

Thus, a new and improved semiconductor/organic light emitting diode is disclosed with improved efficiency and reliability. Further, because the diode is solid state, it does not require vacuum packaging or gas fill packaging. Also, the diode is not single crystal with a potential for large area devices, low cost, low power and relatively easy color display applications. It is anticipated that the diode will be especially useful in image generators for portable displays in portable communication devices, such as portable radios, pagers, portable computers and calculators, etc.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. A diamond/organic light emitting diode comprising:
 a layer of polycrystalline diamond; and
 a layer of electroluminescent organic material positioned on a surface of the layer of polycrystalline diamond and forming a junction therebetween, the layer of polycrystalline diamond serving as a carrier injection layer and the layer of electroluminescent organic material emitting light in response to injection of carriers therein.

2. A diamond/organic light emitting diode comprising:
 an electron injection layer including polycrystalline N-type diamond; and
 a light emitting layer including a P-type electroluminescent organic material positioned on a surface of the electron injection layer and forming a junction therebetween.

3. A diamond/organic light emitting diode as claimed in claim 2 wherein the P-type electroluminescent organic material of the light emitting layer includes 8-hydroxyquinoline aluminum.

4. A diamond/organic light emitting diode as claimed in claim 2 wherein the P-type electroluminescent organic material of the light emitting layer includes a conjugated polymer.

5. A diamond/organic light emitting diode as claimed in claim 4 wherein the conjugated polymer includes poly(2-methoxy, 5-(2'-ethyl-hexoxy)-1, 4-phenylene-vinylene).

6. A diamond/organic light emitting diode as claimed in claim 2 wherein the light emitting layer is positioned on a (100) surface of the polycrystalline N-type diamond.

7. A diamond/organic light emitting diode as claimed in claim 2 wherein the light emitting layer is positioned on a (111) surface of the polycrystalline N-type diamond.

* * * * *